(12) United States Patent
Nakamura

(10) Patent No.: US 7,616,510 B2
(45) Date of Patent: Nov. 10, 2009

(54) DYNAMIC SEMICONDUCTOR STORAGE DEVICE AND METHOD FOR OPERATING SAME

(75) Inventor: Yutaka Nakamura, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 11/848,401

(22) Filed: Aug. 31, 2007

(65) Prior Publication Data

US 2008/0117700 A1     May 22, 2008

(30) Foreign Application Priority Data

Nov. 20, 2006   (JP) ............................. 2006-313384

(51) Int. Cl.
*G11C 7/00* (2006.01)
(52) U.S. Cl. ..................................... 365/203; 365/207
(58) Field of Classification Search .................. 365/203, 365/207, 210

See application file for complete search history.

(56) References Cited

U.S. PATENT DOCUMENTS 5,475,639 A * 12/1995 Iwase et al. ............ 365/189.11
6,191,979 B1 * 2/2001 Uekubo .................. 365/185.25
2005/0050439 A1   3/2005 Oresick et al.
2007/0242543 A1 * 10/2007 Romanovskyy et al. ..... 365/208

FOREIGN PATENT DOCUMENTS

JP         11242966       7/1999
JP         2001084767     6/2008

* cited by examiner

*Primary Examiner*—Anh Phung
(74) *Attorney, Agent, or Firm*—Michael J. LeStrange

(57) ABSTRACT

The object of the present invention is to provide a DRAM, in which the operation speed for a sense amplifier can be increased. Bit line precharging circuits PCt and PCb are arranged to precharge bit lines BLt and /BLt to a ground voltage GND, and reference word lines RWLo and RWLe and reference memory cells RMC are arranged, so that when a word line WL is activated, a potential difference is always generated between the bit lines BLt and /BLt. The sources of transistors N10 and N11 of an N-type sense amplifier NSAt are connected directly to a ground terminal GND, and the sources of transistors P2 and P3 of a P-type sense amplifier PSA are connected directly to a power source VDD. The gates of the transistors N10 and N11 are connected to the bit lines /BLt and BLt, and the drains are connected to the bit lines BLt and /BLt, respectively. Shift word lines SWL and shift memory cells SMC are arranged, so that the N sense amplifier NSAt can amplify the potential difference between the bit lines BLt and /BLt.

11 Claims, 6 Drawing Sheets

DYNAMIC SEMICONDUCTOR STORAGE DEVICE AND METHOD FOR OPERATING SAME

FIELD OF THE INVENTION

The present invention relates to dynamic random access memory (DRAM) semiconductor storage device and a method for operating the same.

BACKGROUND OF THE INVENTION

In various systems applications, SRAMs (Static Random Access Memories), which operate faster than DRAMs, have been employed as routers, hubs or cache memories for CPUs (Central Processing Units). However, the development of highly efficient and multifunctional information and communication systems, mandate an increase in memory capacity. The lower cost per bit of DRAM leads to a more cost efficient storage solution than SRAM. By implementing system storage with DRAM, overall bandwidth can be improved for a wide I/O (input/output) data path or a multibank memory. However, compared with SRAMs, DRAMs are remarkably slower in respect to read/write access. Consequently, the use of DRAMs is performance limited.

Japanese Unexamined Patent Publication (Kokai) No. 2001-84767 (patent document 1) discloses a DRAM including a sense amplifier, shown in FIG. 4 in the attached drawings. (FIG. 3 of Kokai) In Kokai, a P-type sense amplifier PSA is shared by bit line pairs BL and /BL, and is connected between sharing lines SA and /SA. The bit lines BL and /BL are separated from the sharing lines SA and /SA by an isolator BLI. An N-type sense amplifier NSA is connected between the bit lines BL and /BL. An equalizing transistor N20 is connected between the bit lines BL and /BL, which is turned on in response to equalizing signal EQN. The bit lines BL and /BL are equalized to a half power voltage VDD/2 by an equalizing transistor N20. The threshold voltages of N-channel MOS transistors N10 and N11 are set low, e.g., about 0.2 V, so that the N-type sense amplifier NSA can detect a potential difference near the half power voltage VDD/2. Further, set transistor N21 is connected between the sources of transistors N10 and N11 and ground terminal GND, in order to prevent transistors N10 and N11 from turning on in response to the half power voltage VDD/2, which would result in the unintentional enabling of the N-type sense amplifier NSA. When set transistor N21 is turned on upon receiving set signal SETN, N-type sense amplifier NSA is activated.

Unfortunately sense amp precharging consumes additional clock cycles because bit lines BL and /BL are precharged to the half power voltage VDD/2. The additional latency associated with detection and amplification presents another operational difficulty, since the start of the operation of the N-type sense amplifier NSA has to be delayed until set transistor N21 is turned on. Additionally, noise is generated due to capacitive coupling between adjacent bit lines BL and /BL when the set transistor N21 is turned on.

Japanese Unexamined Patent Publication No. 2005-50439 discloses a DRAM that includes a sense amplifier, shown in FIG. 5 in the attached drawings. (FIG. 1 in PUPA No. 2005-50439) In this publication, the DRAM is similar to that in Kokai, except for the connection of the N-type sense amplifier NSA. That is, the gates of transistors N10 and N11 are connected to bit lines /BL and BL, while the drains are connected to sharing lines SA and /SA. When the transistor P1 is turned on in response to the equalizing signal EQP, sharing lines SA and /SA are equalized, and precharged to 1.2 V, which is slightly lower than the power voltage VDD (=1.6 V). Conversely, when the transistor N20 is turned on in response to equalizing signal EQN, bit lines BL and /BL are equalized. Since the voltage on sharing lines SA and /SA is clamped by transistors N6 and N7 of an isolator BLI, the bit lines BL and /BL are precharged to 0.4 V, which is lower by a value equivalent to the threshold voltage (0.8 V) of transistors N6 and N7 than 1.2 V for sharing lines SA and /SA.

According to the DRAM disclosed in PUPA No. 2005-50439, since the parasitic capacitance of bit lines BL and /BL is reduced by a value equivalent to the drain capacitance of transistors N10 and N11, a potential difference between bit lines /BL and BL through the reading operation is slightly increased. However, amplification of the voltage on sharing lines SA and /SA is completed after the set transistor N21 is turned on in response to the set signal SETN. Therefore, the data read period is shorter than the period required in Kokai; however, since the start of the operation of the N-type sense amplifier NSA waits until set transistor N21 is turned on, the data reading period is extended by a value equivalent to this delay.

J. E. Barth, Jr., et al., "Embedded DRAM design and architecture for the IBM 0.11-µm ASIC offering", IBM J. Res. & Dev., Vol. 46, November 2002, pp. 676-689 (Barth), discloses a DRAM with a sense amplifier, shown in FIG. 6 in the attached drawings (FIG. 8 in Barth) In this document, bit line precharging circuit PC is implemented and bit lines /BL and BL are precharged to ground voltage GND in response to equalizing signal EQN. Further, reference memory cell RMC is connected to bit line /BL, which differs from the bit line BL connected to memory cell MC. When transistor N2 is turned on in response to precharge request signal REQP, half power voltage VDD/2 is applied to reference memory cell RMC. Reference word line RWL is activated together with word line WL, and electric charges are re-distributed into bit line /BL and reference memory cell RMC. Sense amplifiers PSA and NSA employ the voltage of bit line /BL as a reference voltage, and detect and amplify a potential difference between bit lines /BL and BL.

In this case, sense amplifiers PSA and NSA are not shared. Bit lines /BL and BL are connected to local data lines LDL and /LDL through column selection gates N14 and N15, and are also connected to global data lines GDL and /GDL through a local read/write circuit 1.

According to the DRAM disclosed in Barth, since bit lines /BL and BL are precharged to ground GND and the operation of N-type sense amplifier NSA is not accidentally enabled, the sources of transistors N10 and N11 are connected directly to ground terminal GND. On the other hand, since the operation of P-type sense amplifier PSA may be triggered, set transistor P4 is required. Furthermore, since the data lines having a large parasitic capacitance are hierarchically structured, the concomitant increase of parasitic capacitance of bit lines /BL and BL can be suppressed by asserting column selection gates N14 and N15. However, since the local read/write circuit 1 must be additionally provided, the total circuit area required becomes prohibitively large.

SUMMARY OF THE INVENTION

An object of the present invention is to provide a dynamic semiconductor storage device and a method for operating the same in which the operation speed for an integrated sense amplifier can be increased.

A dynamic semiconductor storage device, according to the present invention, comprises: a first bit line; a second bit line arrayed in pairs with the first bit line; a word line intersecting the first and second bit lines; a memory cell connected to the first bit line and the word line; a reference word line intersecting the first and second bit lines; a reference memory cell connected to the second bit line and the reference word line; means for activating the word line; bit line precharging means for precharging the first and second bit lines to a ground voltage or a power voltage before the word line is activated; means for activating the reference word line when the word line is activated; reference voltage precharging means for precharging the reference memory cell to a reference voltage before the reference word line is activated; level shift means for shifting voltage levels of the first and second bit lines when the word line is activated; a first sharing line; a second sharing line arrayed in pairs with the first sharing line; a first isolator connected between the first and second bit lines and the first and second sharing lines; a sense amplifier of first conductivity type connected between the first and second sharing lines; and a first sense amplifier of second conductivity type. The first sense amplifier of second conductivity type includes: a first field-effect transistor of second conductivity type having a gate connected to the second bit line and a drain connected to the first sharing line or the first bit line; and a second field-effect transistor of second conductivity type having a gate connected to the first bit line and a drain connected to the second sharing line or the second bit line. Here, when the first conductivity type is the P-type, the second conductivity type is the N-type, and when the first conductivity type is the N-type, the second conductivity type is the P-type. Further, when the first and second bit lines are precharged to the ground voltage, the level shift means raises the voltage levels of the first and second bit lines. On the other hand, when the first and second bit lines are precharged to the power voltage, the level shift means drops the voltage levels of the first and second bit lines.

According to the present invention, since the first and second bit lines are precharged to ground or VDD, the precharging period is reduced, compared with the case when the first and second bits are precharged to the intermediate voltage between the power voltage and the ground voltage, and as a result, the operation speed of the sense amplifier is increased. Even when the first and second bit lines are precharged to the ground voltage or the power voltage, the reference word line is activated at the same time as the word line is activated, and electric charges are re-distributed into the second bit line and the reference memory cell. Therefore, a potential difference is always generated between the first and second bit lines. Further, since the voltage levels of the first and second bit lines are shifted when the word line is activated, the first sense amplifier of the second conductivity type appropriately detects and amplifies the potential difference between the first and second bit lines.

Preferably, the drain of the first field-effect transistor of second conductivity type is connected to the first sharing line. The drain of the second field-effect transistor of second conductivity type is connected to the second sharing line. The sources of the first and second field-effect transistors of second conductivity are directly connected to a ground or a power source. The sense amplifier of first conductivity type includes: a first field-effect transistor of first conductivity type having a gate connected to the second sharing line, a drain connected to the first sharing line and a source directly connected to the power source or the ground; and a second field-effect transistor of first conductivity type having a gate connected to the first sharing line, a drain connected to the second sharing line and a source directly connected to the power source or the ground.

In this case, since the drain of the first field-effect transistor of second conductivity type is connected to the first sharing line, not to the first bit line, and the drain of the second field-effect transistor of second conductivity type is connected to the second sharing line, not to the second bit line, the parasitic capacitances of the bit lines are reduced, a potential difference between the bit lines is increased, and the amplification speed is raised. Further, since the potential amplification is performed only for the sharing lines that indicate a small parasitic capacitance, the amplification speed is further increased.

A method for operating a dynamic semiconductor storage device, according to the present invention, comprises the steps of: precharging the first and second bit lines to a ground voltage or a power voltage before the word line is activated; precharging the reference memory cell to a reference voltage before the reference word line is activated; activating the word line and the reference word line after the first and second bit lines and the reference memory cell are precharged; shifting voltage levels of the first and second bit lines when the word line is activated; turning on an isolator when a predetermined period elapses since the word line is activated; inactivating the word line when a predetermined period elapses since the isolator is turned on; and re-precharging the first and second bit lines to the ground voltage or the power voltage after the word line is inactivated.

According to the present invention, since the first and second bit lines are precharged to the ground or VDD, the precharging period is shorter than when the first and second bit lines are precharged to an intermediate voltage between VDD and ground. As a result, the operational latency of the sense amplifier is decreased. Even when the first and second bit lines are precharged to ground or the VDD, the reference word line is activated at the same time as the word line, and electric charges are re-distributed into the second bit line and the reference memory cell. Thus, a potential difference is always generated between the first and second bit lines. Further, since the voltage levels of the first and second bit lines are shifted when the word line is activated, the first sense amplifier of a second conductivity type appropriately detects and amplifiers the potential difference between the first and second bit lines.

Preferably, the method for operating a dynamic semiconductor storage device further comprises the step of: re-precharging the reference memory cell to the reference voltage when a predetermined period elapses since the word line is activated.

In this case, since the reference memory cell is re-precharged when a predetermined period elapses since the word line is activated, a period for the amplification sequence performed by the sense amplifier is not extended due to the addition of the precharging period.

Preferably, the method for operating a dynamic semiconductor storage device further comprises the steps of: precharging first and second shift memory cells to a shift voltage before a shift word line is activated; activating the shift word line when the word line is activated; and re-precharging the first and second shift memory cells to the shift voltage when a predetermined period elapses since the word line is activated.

In this case, since the shift memory cells are re-precharged when a predetermined period elapses since the word line is activated, the period for the amplification sequence performed by the sense amplifier is not extended due to the additional precharging period.

DETAILED DESCRIPTION OF THE INVENTION

Figure 1:
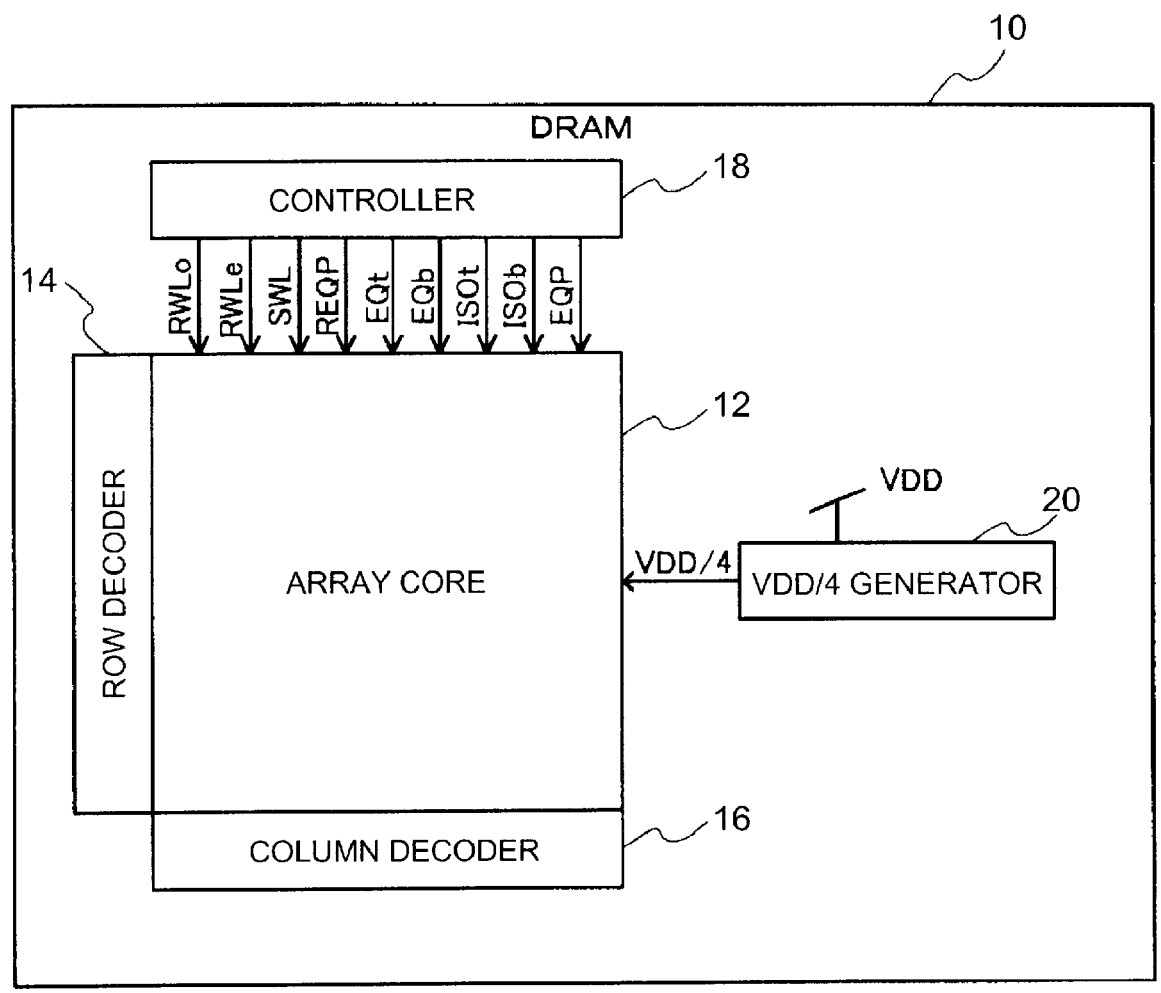
FIG. 1 is a functional block diagram showing the general arrangement of a DRAM according to one embodiment of the present invention.

Preferred embodiments of the present invention will now be described in detail with reference to the drawings. The same reference numerals are provided for identical or corresponding sections in the drawings, and the same explanation will be quoted for the identical sections.

As shown in FIG. 1, a DRAM 10 according to this embodiment comprises an array core 12, a row decoder 14, a column decoder 16, a controller 18 and a VDD/4 generator 20. The row decoder 14 selects and drives word lines (not shown) in the array core 12 in response to a row address signal. The column decoder 16 selects and drives column selection lines (not shown) in the array core 12 in response to a column address signal. The controller 18 generates various types of control signals, and transmits them to the array core 12. The VDD/4 generator 20 generates a quarter power voltage VDD/4 that is a quarter of a power voltage VDD, and transmits this voltage to the array core 12.

Figure 2:
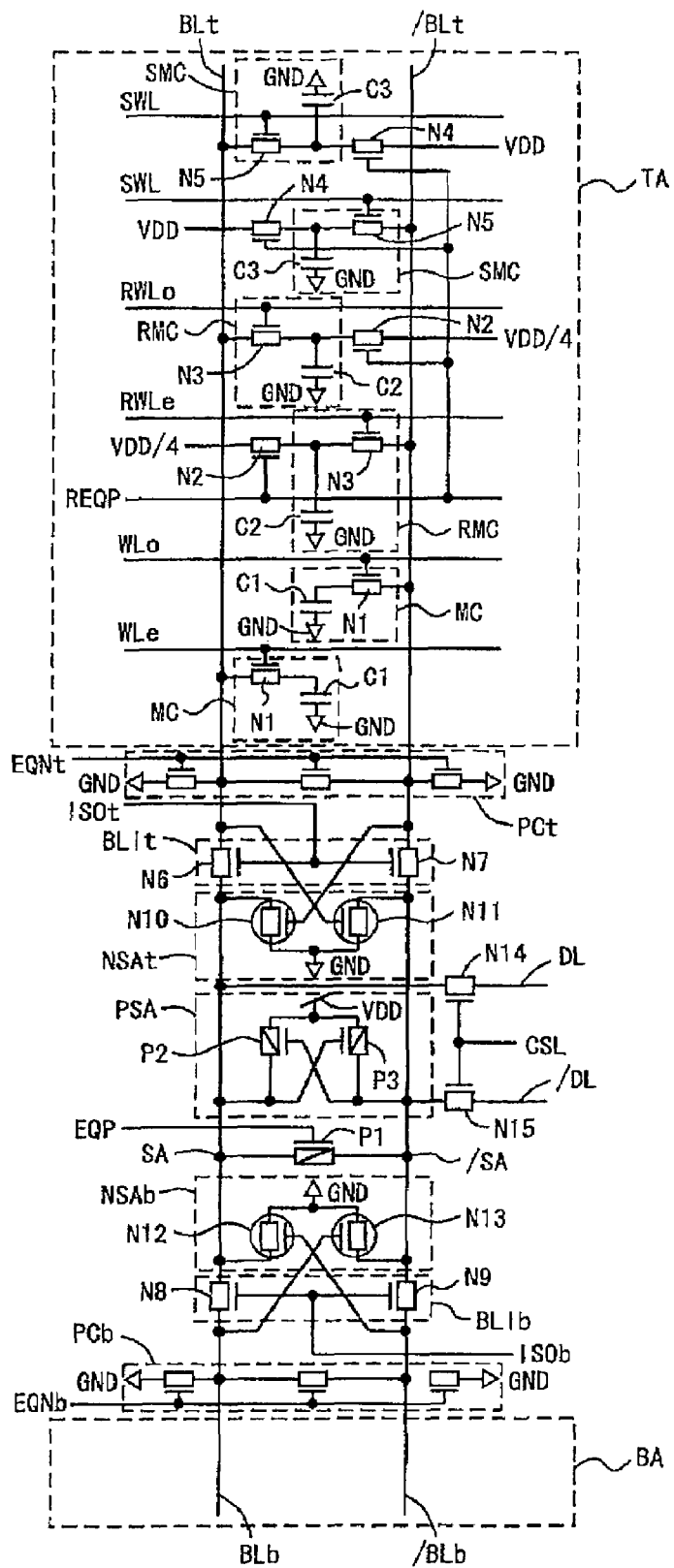
FIG. 2 is a circuit diagram showing the array core of the DRAM shown in FIG. 1.

As shown in FIG. 2, the array core 12 includes a top array TA and a bottom array BA, bit line precharging circuits PCt and PCb, isolators BLIt and BLIb, a P-type sense amplifier PSA, and N-type sense amplifiers NSAt and NSAb.

The top array TA includes a plurality of memory cells MC arrayed in a matrix, a plurality of word lines WLo and WLe (in some cases, these word lines may be collectively referred to simply as "WL") arranged in rows, and a plurality of bit lines BLt and /BLt arranged in columns. In FIG. 2, a pair of bit lines BLt and /BLt, one memory cell MC located on the side of the bit line BLt, one memory cell MC located on the side of the bit line /BLt, the odd numbered word line WLo and the even numbered word line WLe are representatively shown. It should be noted that although the drawings and the detailed explanation are not given, the bottom array BA also has the same configuration as the top array TA.

Each memory cell MC is connected to the corresponding bit line BLt or /BLt and the corresponding word line WLo or WLe, and includes an N channel MOS transistor N1 and a cell capacitor C1. The transistor N1 includes a gate connected to the corresponding word line WLo or WLe, a source/drain connected to the corresponding bit line BLt or /BLt, and a source/drain connected to one of electrodes of the cell capacitor C1. The other electrode of the cell capacitor C1 is connected to ground terminal GND.

The top array TA further includes reference memory cells RMCs, each of which is arranged for one bit line BLt or /BLt, N channel MOS transistors N2, each of which is arranged for one reference memory cell RMC, and two reference word lines RWLo and RWLe (these word lines may be representatively referred to simply as "RWL").

Each reference memory cell RMC is connected to the corresponding bit line BLt or /BLt and the corresponding reference word line RWLo or RWLe, and includes an N channel MOS transistor N3 and a reference capacitor C2. The transistor N3 includes a gate connected to the corresponding reference word line RWLo or RWLe, a source/drain connected to the corresponding bit line BLt or /BLt, and a source/drain connected to one of electrodes of the reference capacitor C2. The other electrode of the reference capacitor C2 is connected to the ground terminal GND. Each of the transistors N2 includes a gate for receiving a precharge request signal REQP, a source connected to one of the electrodes of reference capacitor C2, and a drain for receiving a quarter power voltage VDD/4. That is, the transistors N2 precharge the reference capacitors C2 to the quarter power voltage VDD/4 in response to the precharge request signal REQP.

The top array TA also includes shift memory cells SMC, each of which is provided for the bit line BLt or /BLt, N channel MOS transistors N4, which are arranged for the shift memory cells SMC, respectively, and two shift word lines SWL.

Each of the shift memory cells SMC is connected to the corresponding bit line BLt or /BLt and the corresponding shift word line SWL, and includes an N channel MOS transistor N5 and a shift capacitor C3. The transistor N5 includes a gate connected to the corresponding shift word line SWL, a source/drain connected to the corresponding bit line BLt or /BLt, and a source/drain connected to one of the electrodes of the shift capacitor C3. The other electrode of the shift capacitor C3 is connected to the ground terminal GND. Each of the transistors N4 includes a gate for receiving a precharge request signal REQP, a source connected to one of the electrodes of the shift capacitor C3, and a drain for receiving a power voltage VDD. That is, the transistors N4 precharge the shift capacitors C3 to the power voltage VDD in response to the precharge request signal REQP. Therefore, the shift memory cells SMC, the transistors N4 and the shift word lines SWL constitute means for raising the voltage levels of the bit lines BLt and /BLt when the word line WL is activated.

Bit line precharging circuit PCt equalizes bit lines BLt and /BLt in response to equalizing signal EQNt, and precharges the bit lines BLt and /BLt to ground voltage GND. Bit line precharging circuit PCb equalizes bit lines BLb and /BLb in response to equalizing signal EQNb, and precharges bit lines BLb and /BLb to ground voltage GND.

Bit lines BLt and /BLt are connected to sharing lines SA and /SA via isolator BLIt. Isolator BLIt includes N channel MOS transistors N6 and N7 that are turned on in response to isolation control signal ISOt. Bit lines BLb and /BLb are connected to sharing lines SA and /SA via isolator BLIb. Isolator BLIb includes N channel MOS transistors N8 and N9 that are turned on in response to isolation control signal ISOb.

An equalizing transistor (P channel MOS transistor) PI, which is turned on in response to equalizing signal EQP, is connected between sharing lines SA and /SA. Further, P-type sense amplifier PSA is connected between sharing lines SA and /SA.

P-type sense amplifier PSA includes P channel MOS transistors P2 and P3. The gate of transistor P2 is connected to sharing line /SA, and the drain is connected to sharing line SA. The gate of transistor P3 is connected to sharing line SA, and the drain is connected to sharing line /SA. The sources of transistors P2 and P3 are connected directly to power source VDD.

N-type sense amplifier NSAt includes N channel MOS transistors N10 and N11. The gate of transistor N1 is connected to bit line /BLt, and the drain is connected to sharing line SA. The gate of transistor N11 is connected to bit line BLt, and the drain is connected to sharing line /SA. The sources of transistors N10 and N11 are directly connected to ground terminal GND.

N-type sense amplifier NSAb includes N channel MOS transistors N12 and N13. The gate of transistor N12 is connected to bit line /BLt, and the drain is connected to sharing line SA. The gate of transistor N13 is connected to bit line BLt, and the drain is connected to sharing line /SA. The sources of transistors N12 and N13 are connected directly to ground terminal GND.

Array core 12 further includes column selection gates (N channel MOS transistors) N14 and N15 that are turned on in response to column selection signal CSL. Column selection gate N14 is connected between sharing line SA and data line DL. Column selection gate N15 is connected between sharing line /SA and data line /DL.

In this case, the threshold voltage for transistors N10 to N13 is 0.2 to 0.3 V, which is lower than the threshold voltage (typically, 0.5 to 0.6 V) for transistors P1 to P3, N1 to N9, N14 and N15.

Power voltage VDD is 1.6 V. As will be described later, since power voltage VDD is applied to the gates of isolators BLIt and BLIb, power voltage VDD is clamped by isolators BLIt and BLIb, and the internal voltage of the array is lower (0.8 V in this embodiment) than power voltage VDD by a value equivalent to the threshold voltage of transistors N6 to N9.

Figure 3:
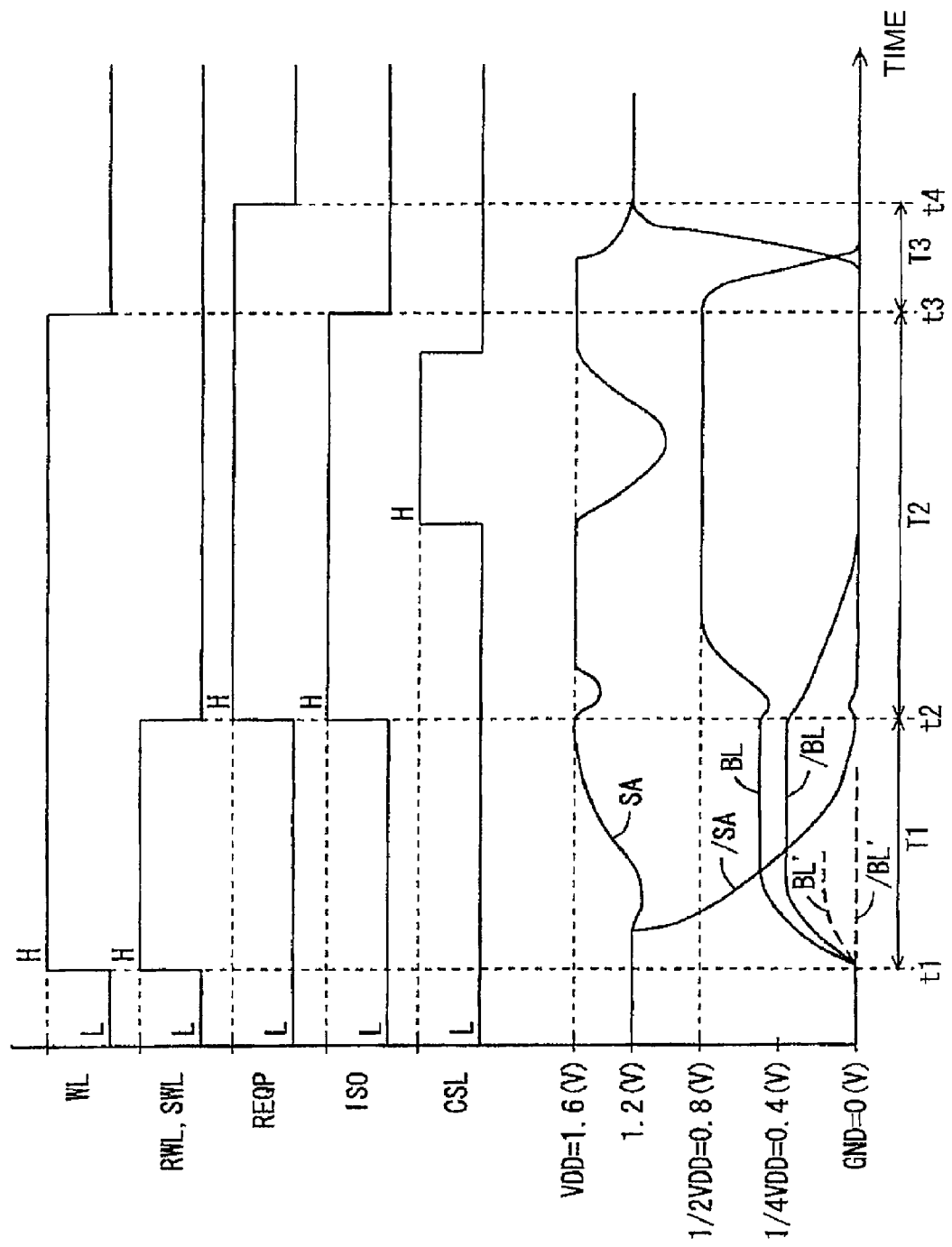
FIG. 3 is a timing chart showing the reading operation performed for the array core shown in FIG. 2.
Figure 4:
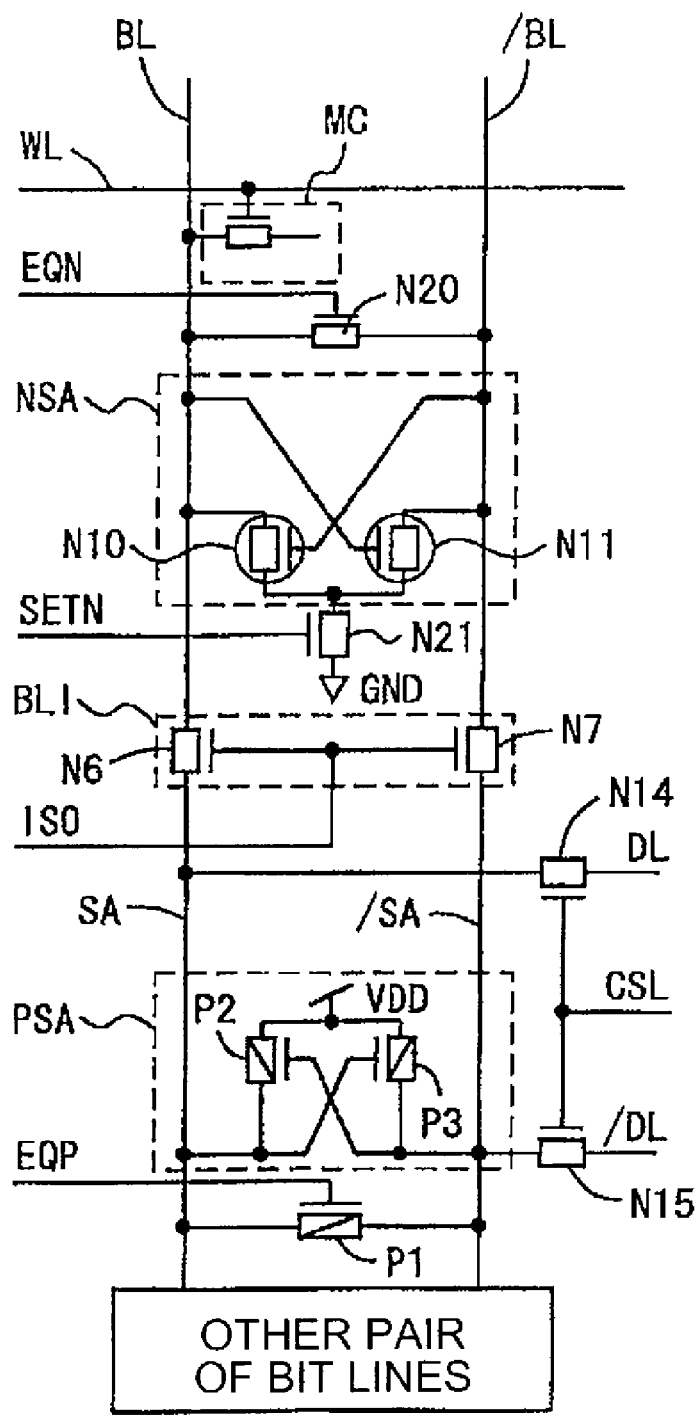
FIG. 4 is a circuit diagram showing an array core for a conventional DRAM.
Figure 5:
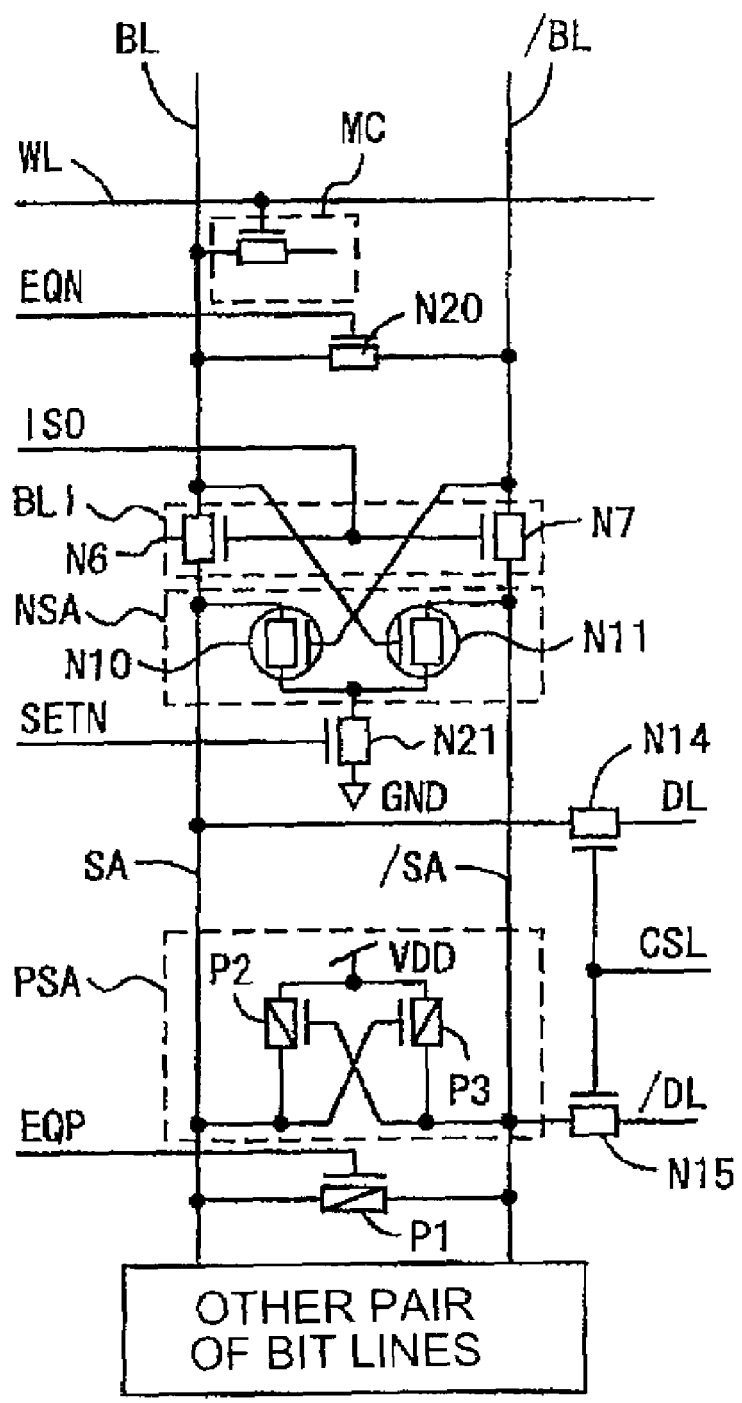
FIG. 5 is a circuit diagram showing another array core for a conventional DRAM.
Figure 6:
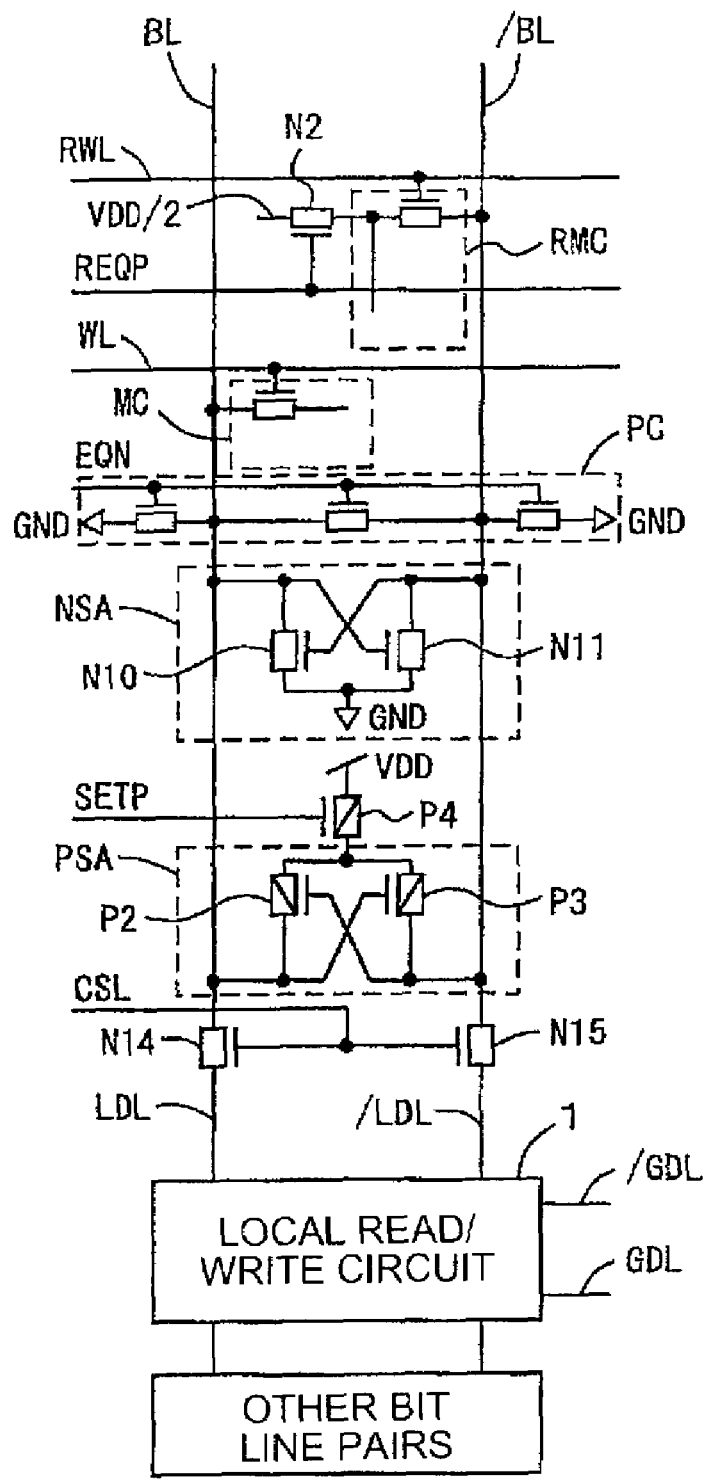
FIG. 6 is a circuit diagram showing one more array core for a conventional DRAM.

The reading operation for this DRAM will now be described with reference to the timing chart in FIG. 3.

Before time t1, bit lines BLt and /BLt are precharged to GND by bit line precharging circuit PCt. Sharing lines SA and /SA are equalized and precharged, by equalizing transistor P1, to a voltage (1.2 V in this embodiment) higher than bit lines BLt and /BLt.

At time t1, when the voltage on word line WL is raised up to the power voltage VDD level (1.6 V in this embodiment), a potential difference occurs between bit lines BLt and /BLt. The detailed explanation for this will be given below.

When even numbered word line WLe is asserted, charges are re-distributed into memory cell MC and bit line BLt that are connected to word line WLe. Since bit line BLt is precharged to ground, the voltage on bit line BLt is raised in the case where data stored in memory cell MC is at level H, or the voltage on bit line BLt is not raised in a case wherein data stored in the memory cell MC is at level L, and the ground voltage GND is maintained. However, since reference word line RWLe is driven at the same time as even numbered word line WLe is driven, electric charges are re-distributed into reference memory cell RMC and bit line /BLt that are connected to reference word line RWLe. Since quarter power voltage VDD/4 is applied in advance to reference memory cell RMC by transistor N2, the voltage of bit line /BLt is always slightly raised, and the obtained voltage is employed as a reference voltage. Therefore, when even numbered word line WLe is driven, the voltage of bit line BLt always becomes either higher or lower than the reference voltage.

When odd numbered word line WLo is driven, electric charges are re-distributed into memory cell MC and bit line /BLt that are connected to word line WLo. Since bit line /BLt is precharged to ground voltage GND, the voltage on bit line /BLt is raised in a case wherein data stored in memory cell MC is at level H, or the voltage on bit line /BLt is not raised in a case wherein data stored in the memory cell MC is at level L, and ground voltage GND is maintained. However, since reference word line RWLo is also driven at the same time as odd numbered word line WLo is driven, electric charges are re-distributed into reference memory cell RMC and bit line BLt that are connected to reference word line RWLo. Since quarter power voltage VDD/4 is applied in advance to reference memory cell RMC by transistor N2, the voltage on bit line BLt is always slightly raised, and the obtained voltage is employed as a reference voltage. Therefore, when odd numbered word line WLo is driven, the voltage of bit line /BLt always becomes either higher, or lower than the reference voltage.

In this manner, a potential difference is always generated between bit lines BLt and /BLt when word line WL is driven. If shift memory cells SMC are not present, the voltages on bit lines BLt' and /BLt' are 0 V and 0.2 V as shown in FIG. 3, and do not rise very high. When the voltages of bit lines BLt' and /BLt' are too low as in this example, N-type sense amplifier NSAt can not detect and amplify the potential difference even if the threshold voltage for transistors N10 and N11 is low.

Therefore, for this embodiment, shift memory cells SMC, transistors N4 and shift word lines SWL are arranged in order to raise the voltages of bit lines BLt' and /BLt'. That is, since shift word line SWL, as well as reference word line RWL, is driven, when word line WL is driven, electric charges are re-distributed into shift memory cell SMC and corresponding bit line BLt or /BLt. Since power voltage VDD is applied in advance to shift memory cells SMC by transistors N4, the voltages of bit lines BLt and /BLt are raised to near quarter power voltage VDD/4 (0.4 V in this embodiment), which can be detected by N-type sense amplifier NSAt.

Furthermore, in this embodiment, since bit lines BLt and /BLt are precharged to ground voltage GND, unlike in the conventional art, a set transistor need not be connected between N-type sense amplifier NSAt and ground terminal GND, and the sources of transistors N10 and N11 are directly connected to ground terminal GND. Therefore, when a potential difference is generated between bit lines BLt and /BLt as described above, prior to time t2, at which isolation control signal ISOt goes to level H and isolation device BLIt is turned on, N-type sense amplifier NSAt is voluntarily activated, and detects the potential difference between bit lines BLt and /BLt. As a result, prior to time t2, N-type sense amplifier NSAt lowers the voltage of one of the sharing lines (/SA in this embodiment) corresponding to bit line BLt or /BLt indicating a lower voltage (/BLt in this embodiment), to ground voltage GND. Similarly, since the sources of transistors P2 and P3 of P-type sense amplifier PSA are connected directly to power source VDD, P-type sense amplifier PSA is also voluntarily activated, and raises the voltage of one of the sharing lines (SA in this embodiment) corresponding to bit line BLt or /BLt indicating a higher voltage (BLt in this embodiment), to the power voltage VDD.

However, since the drains of transistors N10 and N11 are not connected to bit lines /BLt and BLt, and isolator BLIt is still in the off state at this time, P-type sense amplifier PSA and N-type sense amplifier NSAt amplify only the potential difference between the sharing lines SA and /SA, and do not amplify the potential difference between bit lines BLt and /BLt.

In this manner, since the potential difference between sharing lines SA and /SA is amplified prior to time t2, a period T1 from time t1 to time t2 can be considerably shortened, compared with the conventional case. Further, since amplification of the potential difference between bit lines BLt and /BLt is not performed at this time, coupling noise generated between the adjacent bit lines can be reduced.

Sequentially, at time t2, when the isolation control signal ISOt goes to level H (VDD), isolation device BLIt is turned on. At this time, since the gate voltages of transistors N6 and N7 are not raised and are maintained at VDD, the voltage of one of the bit lines indicating a lower voltage (/BLt in this embodiment) is dropped to ground that is the same as sharing line /SA, and the voltage of one of bit lines BLt and /BLt indicating a higher voltage (BLt in this embodiment) is raised but is not raised enough to reach power voltage VDD that is the same level as that of sharing line SA. That is, the voltage of tbit line BLt is clamped by transistor N6, and is raised only up to the VDD-Vth level (Vth is the threshold voltage of transistor N6).

Further, since data read by memory cell MC at time t2 is already latched by P-type sense amplifier PSA and N-type sense amplifier NSAt, reference word line RWL and shift word line SWL become level L at time t2 or earlier, and precharge request signal REQP becomes level H (VDD). Thus, transistors N2 and N4 are turned on instead of transistors N3 and N5, and quarter power voltage VDD/4 is applied to reference memory cell RMC, while power voltage VDD is applied to shift memory cell SMC.

As described above, in this embodiment, reference memory cell RMC and shift memory cell SMC need be precharged, but the precharging period can be any time after data read from memory cell MC is latched and before next word line WL is turned on. Thus, extension of the reading period due to the precharge operation does not occur.

When amplification of the potential difference between bit lines BLt and /BLt is completed, and column selection signal CSL goes to level H (VDD), column selection gates N14 and N15 are turned on, and data signals on sharing lines SA and /SA are read to data lines DL and /DL. After a predetermined period of time elapses, column selection signal CSL is returned to level L.

At time t3, word line WL and isolation control signal ISOt are returned to level L. Thus, data restoration for memory cell MC is completed, and bit lines BLt and /BLt are separated from sharing lines SA and /SA. Also, at time t3, equalizing signal EQNt goes to level H, and bit line precharging circuit PCt precharges bit lines BLt and /BLt to ground voltage GND. A period for precharging bit lines BLt and /BLt to the ground voltage GND is shorter than a period for precharging them to the intermediate voltage, such as quarter power voltage VDD/4. Therefore, a period T3 from time t3 to time t4, at which the precharge operation ends, can be reduced, compared with the conventional case. Additionally, at time 3, equalizing signal EQP goes to level L, and equalizing transistor P1 equalizes sharing lines SA and /SA and precharges sharing lines SA and /SA to 1.2 V.

As described above, according to the present invention, shift word line SWL is activated together with word line WL, and the voltage levels of bit lines BLt and /BLt are raised to around 0.4 V. Therefore, N-type sense amplifier NSAt can appropriately detect the potential difference between bit lines BLt and /BLt. Furthermore, since bit lines BLt and /BLt are precharged to ground voltage GND, a set transistor is not required for N-type sense amplifier NSAt, and the sources of transistors N10 and N11 can be directly connected to ground terminal GND. Therefore, as described above, as soon as the potential difference between bit lines BLt and /BLt is detected, N-type sense amplifier NSAt is voluntarily activated and starts the amplification operation. Similarly, since the sources of transistors P2 and P3 included in P-type sense amplifier PSA are directly connected to power voltage VDD, P-type sense amplifier PSA is also voluntarily activated, and starts the amplification operation. At this time, bit lines BLt and /BLt are separated from sharing lines SA and /SA by isolator BLIt. However, since the gates of transistors N10 and N11 included in N-type sense amplifier NSAt are connected, respectively, to bit lines /BLt and BLt, and the sources are connected to bit lines BLt and /BLt, the potential difference between bit lines BLt and /BLt is not amplified, and only the potential difference between sharing lines SA and /SA is amplified. Since sharing lines SA and /SA are shorter than bit lines BLt and /BLt, and the parasitic capacitances are correspondingly smaller, amplification of the potential difference between sharing lines SA and /SA is completed with minimal latency. As a result, the operational speed of the sense amplifier is increased.

Further, re-precharging of reference memory cell RMC can be performed at an arbitrary time after a predetermined period elapses since the word line is activated, and after the potential difference is generated between bit lines BLt and /BLt. The same condition is applied for re-precharging of shift memory cell SMC. Therefore, the precharging of reference memory cell RMC and shift memory cell SMC does not delay the sense amplifier operation.

In the above embodiment, bit lines BL and /BL are precharged to ground voltage GND. However, bit lines BLt and /BLt may be precharged to power voltage VDD. In this case, N-type sense amplifiers NSAt and NSAb used for this embodiment should be replaced with P-type sense amplifiers, and P-type sense amplifier PSA should be replaced with an N-type sense amplifier. Further, shift memory cell SMC should be precharged to ground voltage GND, and on the contrary to the embodiment, the voltage levels of bit lines BLt and /BLt should be reduced slightly. Further, reference memory cell RMC must be precharged to a voltage, such as a 3VDD/4. Then, regardless of whether data of level H or level L is stored in memory cell MC, a potential difference is generated between bit lines BLt and /BLt.

Further, two shift word lines SWL are provided in the above embodiment, but these may be shared and one shift word line can be provided.

The embodiments of the present invention have been described, but the embodiments are merely examples for carrying out the present invention. The present invention is not limited to the above embodiments, and the embodiments can be variously modified without departing from the subject of the invention.

The invention claimed is:

1. A dynamic semiconductor storage device comprising:
 a first bit line;
 a second bit line arrayed in pairs with the first bit line;
 a word line intersecting the first and second bit lines;
 a memory cell connected to the first bit line and the word line;
 a reference word line intersecting the first and second bit lines;
 a reference memory cell connected to the second bit line and the reference word line;
 means for activating the word line;
 bit line precharging means for precharging the first and second bit lines to a ground voltage or a power voltage before the word line is activated;
 means for activating the reference word line when the word line is activated;
 reference voltage precharging means for precharging the reference memory cell to a reference voltage before the reference word line is activated;
 level shift means for shifting voltage levels of the first and second bit lines when the word line is activated;
 a first sharing line;

a second sharing line arrayed in pairs with the first sharing line;
a first isolator connected between the first and second bit lines and the first and second sharing lines;
a sense amplifier of first conductivity type connected between the first and second sharing lines; and
a first sense amplifier of second conductivity type;
wherein the first sense amplifier of second conductivity type includes:
a first field-effect transistor of a second conductivity type having a gate connected to the second bit and a drain connected to the first sharing line or the first bit line, and
a second field-effect transistor of second conductivity type having a gate connected to the first bit line and a drain connected to the second sharing line or the second bit line.

2. The dynamic semiconductor storage device according to claim 1, wherein the level shift means comprises:
a shift word line intersecting the first and second bit lines;
a first shift memory cell connected to the first bit line and the shift word line;
a second shift memory cell connected to the second bit line and the shift word line;
means for activating the shift word line when the word line is activated; and
shift voltage precharging means for precharging the first and second shift memory cells to a shift voltage before the shift word line is activated.

3. The dynamic semiconductor storage device according to claim 2, wherein
the first shift memory cell includes:
a first capacitor; and
a first field-effect transistor (FET) having a gate connected to the shift word line, a source/drain connected to the first bit line, and a source/drain connected to one of electrodes of the first capacitor;
the second shift memory cell includes:
a second capacitor; and
a second FET having a gate connected to the shift word line, a source/drain connected to the second bit line, and a source/drain connected to one of the second capacitors; and
the shift voltage precharging means comprises:
a third FET being turned on before the shift word line is activated for supplying the shift voltage to the first capacitor; and
a fourth FET being turned on before the shift word line is activated for supplying the shift voltage to the second capacitor.

4. The dynamic semiconductor storage device according to claim 1, wherein
the drain of the first FET of second conductivity type is connected to the first sharing line;
the drain of the second FET of second conductivity type is connected to the second sharing line;
the sources of the first and second FETs of the second conductivity type are directly connected to a ground or a power source; and
the sense amplifier of the first conductivity type comprises:
a first FET of first conductivity type having a gate connected to the second sharing line, a drain connected to the first sharing line and a source directly connected to the power source or the ground; and
a second FET of first conductivity type having a gate connected to the first sharing line, a drain connected to the second sharing line and a source directly connected to the power source or the ground.

5. The dynamic semiconductor storage device according to claim 4, wherein a threshold voltage for the first and second FETs of second conductivity type in the first sense amplifier of second conductivity type is lower than a threshold voltage for the first and second field-effect transistors of first conductivity type in the sense amplifier of first conductivity type.

6. The dynamic semiconductor storage device according to claim 1, further comprising:
a third bit line;
a fourth bit line arrayed in pairs with the third bit line;
a second isolator connected between the first and second sharing lines and the third and fourth bit lines; and
a second sense amplifier of second conductivity type;
wherein the second sense amplifier of second conductivity type includes:
a third FET of second conductivity type having a gate connected to the fourth bit line and a drain connected to the first sharing line or the bit line; and
a fourth FET of second conductivity type having a gate connected to the third bit line and a drain connected to the second sharing line or the fourth bit line.

7. The dynamic semiconductor storage device according to claim 6, wherein
the drain of the third FET of second conductivity type is connected to the first sharing line;
the drain of the fourth FET of second conductivity type is connected to the second sharing line;
the sources of the third and fourth FETs of second conductivity type are directly connected to the ground or the power source; and
the sense amplifier of first conductivity type comprises:
a first FET of first conductivity type having a gate connected to the second sharing line, a drain connected to the first sharing line and a source directly connected to the power source or the ground; and
a second FET of first conductivity type having a gate connected to the first sharing line, a drain connected to the second sharing line and a source directly connected to the power source or the ground.

8. The dynamic semiconductor storage device according to claim 7, wherein a threshold voltage for the third and fourth FETs of second conductivity type in the second sense amplifier of second conductivity type is lower than a threshold voltage for the first and second FETs of first conductivity type in the sense amplifier of first conductivity type.

9. A method for operating a dynamic semiconductor storage device that comprises:
a first bit line;
a second bit line arrayed in pairs with the first bit line;
a word line intersecting the first and second bit lines;
a memory cell connected to the first bit line and the word line;
a reference word line intersecting the first and second bit lines;
a reference memory cell connected to the second bit line and the reference word line;
a first sharing line;
a second sharing line arrayed in pairs with the first sharing line;
an isolation device connected between the first and second bit lines and the first and second sharing lines;
a sense amplifier of first conductivity type connected between the first and second sharing lines; and
a sense amplifier of second conductivity type, the sense amplifier of second conductivity type including:

a first FET of second conductivity type having a gate connected to the second bit line and a drain connected to the first sharing line or the first bit line; and a second FET of second conductivity type having a gate connected to the first bit line and a drain connected to the second sharing line or the second bit line;

the method for operating a dynamic semiconductor storage device comprising the steps of:

precharging the first and second bit lines to a ground voltage or a power voltage before the word line is activated;

precharging the reference memory cell to a reference voltage before the reference word line is activated;

activating the word line and the reference word line after the first and second bit lines and the reference memory cell are precharged;

shifting voltage levels of the first and second bit lines when the word line is activated;

turning on the isolation device when a predetermined period elapses since the word line is activated;

disabling the word line when a predetermined period elapses since the isolation device is turned on; and re-precharging the first and second bit lines to the ground voltage or the power voltage after the word line is disabled.

10. The method for operating a dynamic semiconductor storage device according to claim 9, further comprising the step of:

re-precharging the reference memory cell to the reference voltage when a predetermined period elapses since the word line is activated.

11. The method for operating a dynamic semiconductor storage device according to claim 10, wherein the dynamic semiconductor storage device further comprises:

a shift word line intersecting the first and second bit lines;

a first shift memory cell connected to the first bit line and the shift word line;

a second shift memory cell connected to the second bit line and the shift word line;

the method further comprising the steps of:

precharging the first and second shift memory cells to the shift voltage before the shift word line is activated;

activating the shift word line when the word line is activated; and re-precharging the first and second shift memory cells to the shift voltage when a predetermined period elapses since the word line is activated.

* * * * *